(12) United States Patent
Yuen

(10) Patent No.: US 10,666,020 B2
(45) Date of Patent: May 26, 2020

(54) RECONFIGURABLE EMITTER ARRAY

(71) Applicant: Lumentum Operations LLC, Milpitas, CA (US)

(72) Inventor: Albert Yuen, Palo Alto, CA (US)

(73) Assignee: Lumentum Operations LLC, Milpitas, CA (US)

( * ) Notice: Subject to any disclaimer, the term of this patent is extended or adjusted under 35 U.S.C. 154(b) by 0 days.

(21) Appl. No.: 16/053,522

(22) Filed: Aug. 2, 2018

(65) Prior Publication Data

US 2019/0089131 A1  Mar. 21, 2019

Related U.S. Application Data

(60) Provisional application No. 62/560,935, filed on Sep. 20, 2017.

(51) Int. Cl.
*H01S 5/42* (2006.01)
*H01S 5/343* (2006.01)
(Continued)

(52) U.S. Cl.
CPC ............ *H01S 5/423* (2013.01); *H01S 5/0282* (2013.01); *H01S 5/18311* (2013.01); *H01S 5/18369* (2013.01); *H01S 5/343* (2013.01); *H01S 5/0425* (2013.01); *H01S 5/18308* (2013.01); *H01S 5/18394* (2013.01); *H01S 5/2063* (2013.01); *H01S 2301/176* (2013.01)

(58) Field of Classification Search
CPC ... H01S 5/005–0092; H01S 5/183–187; H01S 5/423; H01S 5/0425
See application file for complete search history.

(56) References Cited

U.S. PATENT DOCUMENTS 4,448,491 A * 5/1984 Okubo .............. G02F 1/133382
257/443
4,982,267 A * 1/1991 Mones .............. H01L 21/67121
257/697

(Continued)

FOREIGN PATENT DOCUMENTS

DE       10150401 A1 * 5/2002  ............. H01L 33/58
WO    WO-03026082 A2 * 3/2003  ......... H01S 5/18305

OTHER PUBLICATIONS

Chua et al., "Independently Addressable VCSEL Arrays on 3-μm Ptich", Jul. 1998, IEEE Photonics Technology Letters, vol. 10, No. 7, 917-919. (Year: 1998).*

*Primary Examiner* — Joshua King
(74) *Attorney, Agent, or Firm* — Harrity & Harrity, LLP

(57) ABSTRACT

An emitter array may comprise a plurality of vertical-emitting devices. The plurality of vertical-emitting devices may be in a two-dimensional pattern of vertical-emitting devices. The emitter array may further comprise a plurality of electrical contacts on a surface of the emitter array. Each of the plurality of electrical contacts may be co-located with and electrically connected to a corresponding vertical-emitting device of the plurality of vertical-emitting devices. The plurality of electrical contacts may provide mechanical support over the plurality of vertical-emitting devices. The plurality of electrical contacts may extend to approximately a same height. A subset of the plurality of vertical-emitting devices may be powered via a corresponding subset of the plurality of electrical contacts.

20 Claims, 5 Drawing Sheets

(51) Int. Cl.
*H01S 5/183* (2006.01)
*H01S 5/028* (2006.01)
*H01S 5/042* (2006.01)
*H01S 5/20* (2006.01)

(56) References Cited

U.S. PATENT DOCUMENTS

| | | | | |
|---|---|---|---|---|
| 5,568,574 A * | 10/1996 | Tanguay, Jr. | ............. | G02B 5/32 359/15 |
| 5,784,396 A * | 7/1998 | Guerin | .................... | H01S 5/423 257/80 |
| 5,814,870 A * | 9/1998 | Spaeth | ................. | H01L 31/0203 257/433 |
| 6,069,908 A * | 5/2000 | Yuen | ....................... | H01S 5/183 372/50.124 |
| 6,222,206 B1 * | 4/2001 | Chirovsky | .......... | H01S 5/18305 257/48 |
| 6,275,513 B1 * | 8/2001 | Chang-Hasnain | .... | H01S 5/0222 372/107 |
| 6,429,461 B1 * | 8/2002 | Tanaka | ................... | G11B 7/127 257/103 |
| 6,759,687 B1 * | 7/2004 | Miller | .................... | H01L 33/58 257/432 |
| 7,164,702 B1 * | 1/2007 | Liu | .......................... | G02B 6/43 372/50.21 |
| 7,949,024 B2 * | 5/2011 | Joseph | .................... | H01S 5/423 372/36 |
| 8,749,796 B2 | 6/2014 | Pesach et al. | | |
| 10,153,614 B1 * | 12/2018 | Lin | ..................... | H01S 5/18333 |
| 2002/0196431 A1 * | 12/2002 | DeFelice | ................. | H01S 5/423 356/237.1 |
| 2005/0169571 A1 * | 8/2005 | Kaneko | ................. | B82Y 20/00 385/14 |
| 2007/0183472 A1 * | 8/2007 | Lee | ..................... | G02B 6/4214 372/50.11 |
| 2011/0002355 A1 * | 1/2011 | Jansen | ................ | H01S 5/02296 372/50.11 |
| 2012/0051685 A1 * | 3/2012 | Su | ......................... | H01S 5/0224 385/14 |
| 2013/0038881 A1 * | 2/2013 | Pesach | ................... | G01B 11/25 356/610 |
| 2013/0272330 A1 * | 10/2013 | Joseph | ............... | H01S 5/02476 372/36 |

\* cited by examiner

US 10,666,020 B2

RECONFIGURABLE EMITTER ARRAY

RELATED APPLICATION

This application claims priority under 35 U.S.C. § 119 to U.S. Provisional Patent Application No. 62/560,935, filed on Sep. 20, 2017, the content of which is incorporated by reference herein in its entirety.

TECHNICAL FIELD

The present disclosure relates to vertical cavity surface emitting lasers (VCSELs) and, more particularly, to powering particular patterns of VCSELs of a VCSEL array.

BACKGROUND

A vertical-emitting device, such as a VCSEL, is a laser in which a beam is emitted in a direction perpendicular to a surface of a substrate (e.g., vertically from a surface of a semiconductor wafer). Multiple vertical-emitting devices may be arranged in an array with a common substrate.

SUMMARY

According to some possible implementations, a vertical cavity surface emitting laser (VCSEL) array, may comprise a plurality of VCSELs, wherein the plurality of VCSELs are in a two-dimensional pattern of VCSELs; a plurality of electrical contacts on a surface of the VCSEL array, wherein an electrical contact, of the plurality of electrical contacts, is co-located with a corresponding VCSEL of the plurality of VCSELs, wherein the plurality of electrical contacts provides mechanical support to an adjacent element over the plurality of VCSELs, wherein the plurality of electrical contacts extends to approximately a same height, wherein the plurality of electrical contacts has a height that is greater than other elements of the VCSEL array on a same surface as the plurality of electrical contacts; and a plurality of metal interconnects on the surface of the VCSEL array, wherein one of the plurality of metal interconnects electrically connects one of the plurality of electrical contacts and one of the plurality of VCSELs that corresponds to the one of the plurality of electrical contacts, wherein a subset of the plurality of VCSELs can be powered via a corresponding subset of the plurality of electrical contacts and a corresponding subset of the plurality of metal interconnects to power an emission pattern that is different than the two-dimensional pattern of VCSELs.

According to some possible implementations, a method may comprise forming an emitter array, wherein forming the emitter array comprises forming a plurality of vertical-emitting devices arranged in a two-dimensional pattern; forming a plurality of metal interconnects on the emitter array, wherein forming the plurality of metal interconnects electrically connects each metal interconnect to a corresponding vertical-emitting device of the plurality of vertical-emitting devices; and forming a plurality of electrical contacts on the plurality of metal interconnects, wherein forming the plurality of electrical contacts electrically connects each of the plurality of electrical contacts to a corresponding metal interconnect of the plurality of metal interconnects, wherein forming the plurality of electrical contacts comprises forming each of the plurality of electrical contacts to be co-located with the corresponding vertical-emitting device of the plurality of vertical-emitting devices, wherein forming the plurality of electrical contacts comprises forming the plurality of electrical contacts to extend to a height that is greater than other elements of the emitter array.

According to some possible implementations, an emitter array, may comprise a plurality of vertical-emitting devices, wherein the plurality of vertical-emitting devices are in a two-dimensional pattern of vertical-emitting devices; a plurality of electrical contacts on a surface of the emitter array, wherein each of the plurality of electrical contacts is co-located with and electrically connected to a corresponding vertical-emitting device of the plurality of vertical-emitting devices, wherein the plurality of electrical contacts provide mechanical support over the plurality of vertical-emitting devices, wherein the plurality of electrical contacts extend to approximately a same height; and wherein a subset of the plurality of vertical-emitting devices can be powered via a corresponding subset of the plurality of electrical contacts.

DETAILED DESCRIPTION

The following detailed description of example implementations refers to the accompanying drawings. The same reference numbers in different drawings may identify the same or similar elements.

Previously, to have an emitter array of vertical-emitting devices that can emit light in a particular pattern, the emitter array would have had to have been manufactured to have vertical-emitting devices in the particular pattern. For example, to have an emitter array with a random pattern of vertical-emitting devices, the emitter array would have had to have been manufactured with the vertical-emitting devices in the random pattern. While this provides an emitter array with a particular pattern of vertical-emitting devices, the emitter array cannot be reconfigured such that a different pattern of vertical-emitting devices emits light, without replacing the emitter array with another emitter array that has vertical-emitting devices configured in the different pattern.

Some implementations, described herein, provide a reconfigurable emitter array. In this way, different patterns of vertical-emitting devices of the emitter array can be powered such that the emitter array emits light in different patterns. This reduces or eliminates a need to replace an emitter array with another emitter array to have a different pattern of light. In addition, this reduces a cost associated with producing emitter arrays for different uses, as a single uniform pattern emitter array can be produced for the different uses. Further, this facilitates use of an emitter array, with a single pattern of vertical-emitting devices, for different uses (e.g., where a customer can configure the pattern using an adjacent element such as an optical element or a metallization layer).

Figure 1:
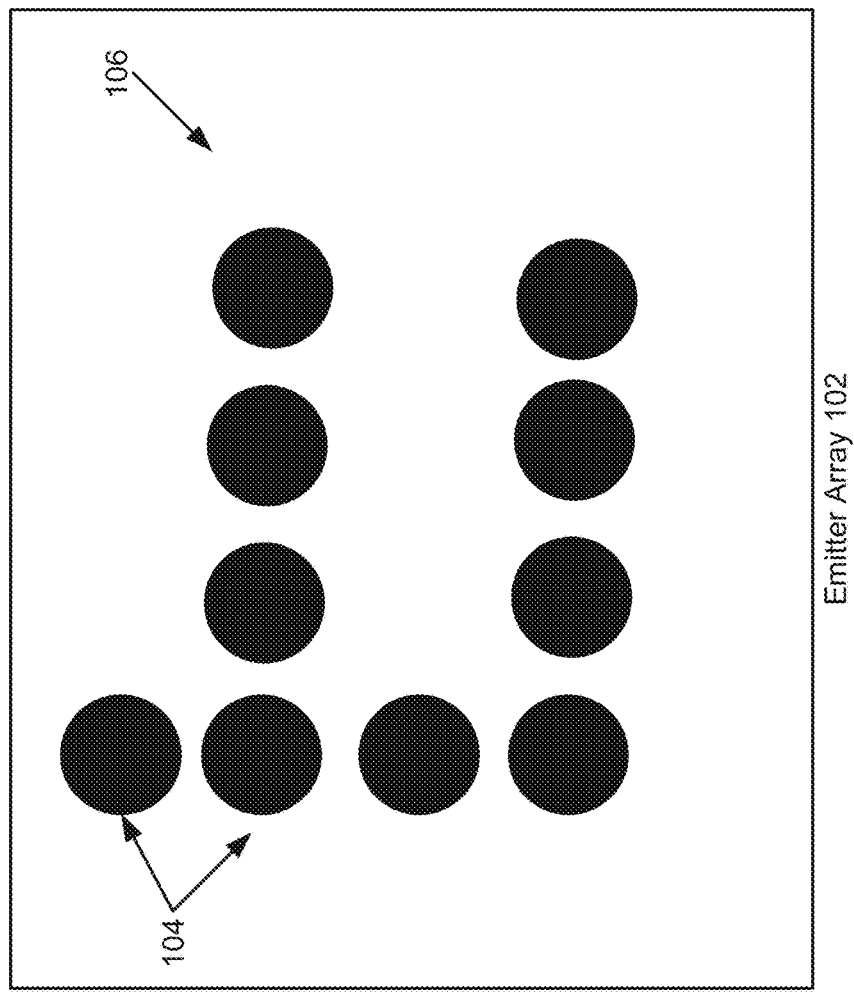
FIG. 1 is a diagram depicting a top-view of a prior emitter array that includes vertical-emitting devices arranged in a particular pattern.

FIG. 1 is a diagram of an example implementation 100 depicting a top-view of a prior emitter array that includes vertical-emitting devices arranged in a particular pattern. As shown in FIG. 1, implementation 100 includes emitter array 102.

As shown in FIG. 1, emitter array 102 includes multiple vertical-emitting devices 104, such as multiple VCSELs. As shown by reference number 106, vertical-emitting devices 104 may be arranged in a particular pattern, such that when vertical-emitting devices 104 are powered, emitter array 102 emits light in the particular pattern.

While this provides an emitter array 102 that can emit light in a particular pattern, emitter array 102 cannot be reconfigured to emit light in a different pattern. If a different pattern of light is needed, such as for a different use, emitter array 102 would have to be replaced with a different emitter array 102 that has vertical-emitting devices 104 arranged in the different pattern. This may be difficult to do as this may require disassembly of a device in which emitter array 102 is included. In addition, this may increase a cost of using a device that includes emitter array 102 for different purposes as different emitter arrays 102 with different patterns of vertical-emitting devices 104 would be needed to facilitate use of the device for the different purposes.

As indicated above, FIG. 1 is provided merely as an example. Other examples are possible and may differ from what was described with regard to FIG. 1.

Figure 2A:
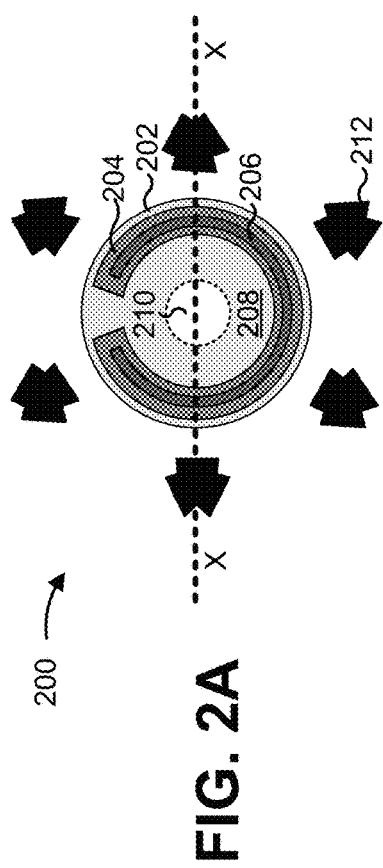
FIGS. 2A-2B are diagrams depicting a top-view of an example vertical-emitting device and a cross-sectional view of the example vertical-emitting device, respectively.
Figure 2B:
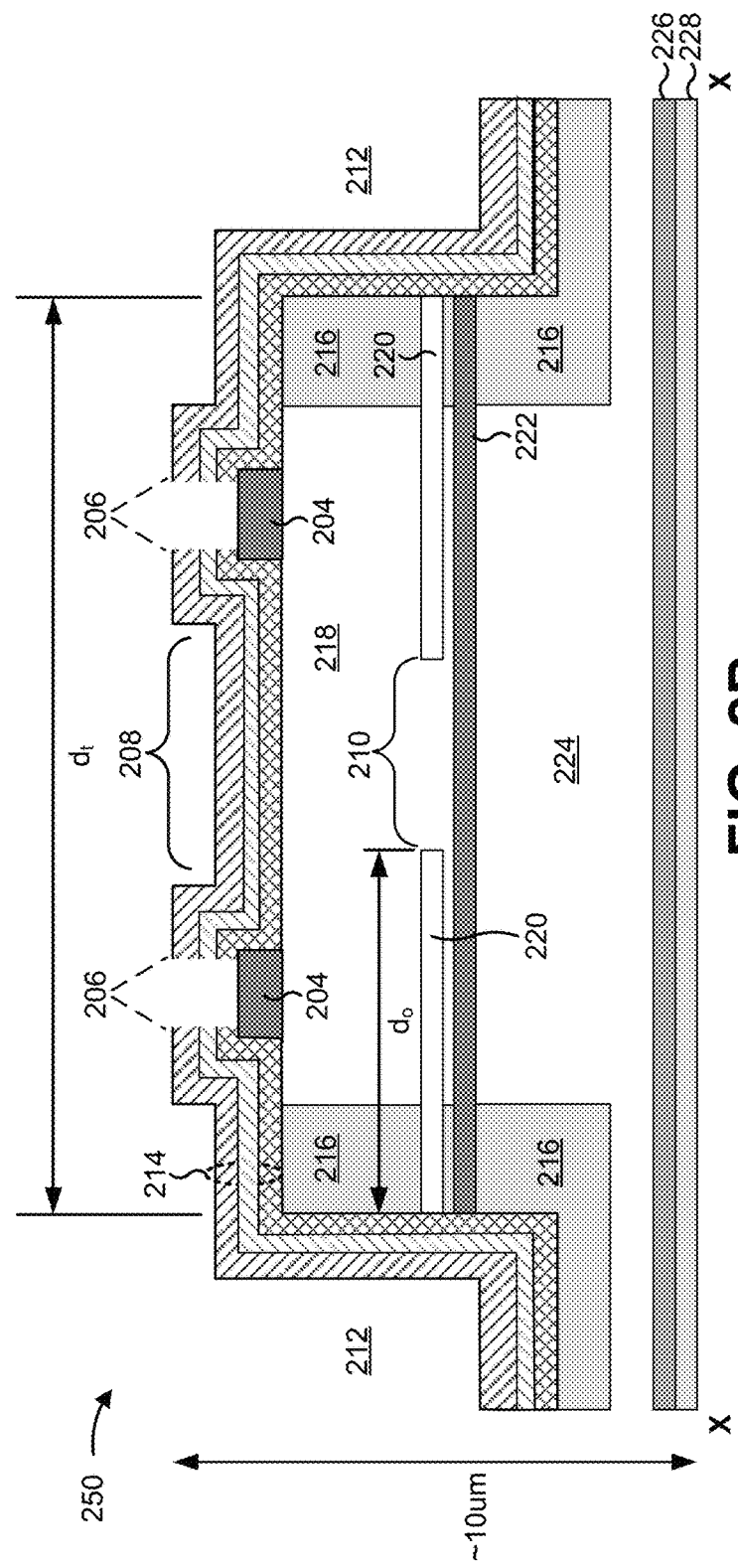

FIGS. 2A and 2B are diagrams depicting a top-view of an example emitter 200 and a cross-sectional view 250 of example emitter 200, respectively. As shown in FIG. 2A, emitter 200 may include a set of emitter layers constructed in an emitter architecture. In some implementations, emitter 200 may correspond to one or more vertical-emitting devices described herein.

As shown in FIG. 2A, emitter 200 includes an implant protection layer 202 that is circular in shape in this example. In some implementations, implant protection layer 202 may have another shape, such as an elliptical shape, a polygonal shape, or the like. Implant protection layer 202 is defined based on a space between sections of implant material included in emitter 200 (not shown). As shown by the medium gray area in FIG. 2A, emitter 200 includes a P-Ohmic metal layer 204 that is constructed in a partial ring-shape (e.g., with an inner radius and an outer radius). As shown, P-Ohmic metal layer 204 is positioned concentrically over implant protection layer 202 (i.e., the outer radius of P-Ohmic metal layer 204 is less than or equal to the radius of implant protection layer 202). Such configuration may be used, for example, in the case of a P-up/top-emitting emitter 200. In the case of a bottom-emitting emitter 200, the configuration may be adjusted as needed.

As further shown in FIG. 2A, emitter 200 includes a dielectric via opening 206 that is formed (e.g., etched) on a dielectric passivation/mirror layer that covers P-Ohmic metal layer 204 (not shown). As shown, dielectric via opening 206 is formed in a partial ring-shape (e.g., similar to P-Ohmic metal layer 204) and is formed concentrically over P-Ohmic metal layer 204 such that metallization of the dielectric passivation/mirror layer contacts P-Ohmic metal layer 204. In some implementations, dielectric opening 206 and/or P-Ohmic metal layer 204 may be formed in another shape, such as a full ring-shape or a split ring-shape.

As further shown, emitter 200 includes an optical aperture 208 in a portion of the emitter within the inner radius of the partial ring-shape of P-Ohmic metal layer 204. Emitter 200 emits a laser beam via optical aperture 208. As further shown, emitter 200 also includes a current confinement aperture 210 (e.g., an oxide aperture formed by an oxidation layer of emitter 200 (not shown)). Current confinement aperture 210 is formed below optical aperture 208.

As further shown in FIG. 2A, emitter 200 includes a set of oxidation trenches 212 that are spaced (e.g., equally, unequally) around a circumference of implant protection layer 202. How close oxidation trenches 212 can be positioned relative to the optical aperture 208 is dependent on the application, and is typically limited by implant protection layer 202, P-Ohmic metal layer 204, dielectric via opening 206, and manufacturing tolerances.

The number and arrangement of layers shown in FIG. 2A are provided as an example. In practice, emitter 200 may include additional layers, fewer layers, different layers, or differently arranged layers than those shown in FIG. 2A. For example, while emitter 200 includes a set of six oxidation trenches 212, in practice, other designs are possible, such as a compact emitter that includes five oxidation trenches 212, seven oxidation trenches 212, and/or the like. As another example, while emitter 200 is a circular emitter design, in practice, other designs are possible, such as a rectangular emitter, a hexagonal emitter, an elliptical emitter, or the like. Additionally, or alternatively, a set of layers (e.g., one or more layers) of emitter 200 may perform one or more functions described as being performed by another set of layers of emitter 200, respectively.

Notably, while the design of emitter 200 is described as including a VCSEL, other implementations are possible. For example, the design of emitter 200 may apply in the context of another type of optical device, such as a light emitting diode (LED), or another type of vertical-emitting (e.g., top emitting or bottom emitting) optical device. Additionally, the design of emitter 200 may apply to emitters of any wavelength, power level, emission profile, or the like. In other words, emitter 200 is not particular to an emitter with a given performance characteristic.

As shown in FIG. 2B, the example cross-sectional view may represent a cross-section of emitter 200 that passes through a pair of oxidation trenches 212 (e.g., as shown by the line labeled "X-X" in FIG. 2A). As shown, emitter 200 may include a backside cathode layer 228, a substrate layer 226, a bottom mirror 224, an active region 222, an oxidation layer 220, a top mirror 218, an implant isolation material 216, a dielectric passivation/mirror layer 214, and a P-Ohmic metal layer 204. As shown, emitter 200 may have a total height that is approximately 10 μm.

Backside cathode layer 228 may include a layer that makes electrical contact with substrate layer 226. For example, backside cathode layer 228 may include an annealed metallization layer, such as an AuGeNi layer, a PdGeAu layer, or the like.

Substrate layer 226 may include a base substrate layer upon which epitaxial layers are grown. For example, substrate layer 226 may include a semiconductor layer, such as a GaAs layer, an InP layer, and/or the like.

Bottom mirror 224 may include a bottom reflector layer of emitter 200. For example, bottom mirror 224 may include a distributed Bragg reflector (DBR).

Active region 222 may include a layer that confines electrons and defines an emission wavelength of emitter 200. For example, active region 222 may be a quantum well.

Oxidation layer 220 may include an oxide layer that provides optical and electrical confinement of emitter 200. In some implementations, oxidation layer 220 may be formed as a result of wet oxidation of an epitaxial layer. For example, oxidation layer 220 may be an $Al_2O_3$ layer formed as a result of oxidation of an AlAs or AlGaAs layer. Oxidation trenches 212 may include openings that allow oxygen (e.g., dry oxygen, wet oxygen) to access the epitaxial layer from which oxidation layer 220 is formed.

Current confinement aperture 210 may include an optically active aperture defined by oxidation layer 220. A size of current confinement aperture 210 may range, for example, from approximately 6.0 µm to approximately 14.0 µm. In some implementations, a size of current confinement aperture 210 may depend on a distance between oxidation trenches 212 that surround emitter 200. For example, oxidation trenches 212 may be etched to expose the epitaxial layer from which oxidation layer 220 is formed. Here, before dielectric passivation/mirror layer 214 is deposited, oxidation of the epitaxial layer may occur for a particular distance (e.g., identified as $d_O$ in FIG. 2B) toward a center of emitter 200, thereby forming oxidation layer 220 and current confinement aperture 210. In some implementations, current confinement aperture 210 may include an oxide aperture. Additionally, or alternatively, current confinement aperture 210 may include an aperture associated with another type of current confinement technique, such as an etched mesa, a region without ion implantation, lithographically defined intra-cavity mesa and regrowth, or the like.

Top mirror 218 may include a top reflector layer of emitter 200. For example, top mirror 218 may include a DBR.

Implant isolation material 216 may include a material that provides electrical isolation. For example, implant isolation material 216 may include an ion implanted material, such as an H implanted material or a Hydrogen/Proton implanted material. In some implementations, implant isolation material 216 may define implant protection layer 202.

Dielectric passivation/mirror layer 214 may include a layer that acts as a protective passivation layer and that acts as an additional DBR. For example, dielectric passivation/mirror layer 214 may include one or more sub-layers (e.g., a $SiO_2$ layer, a $Si_3N_4$ layer) deposited (e.g., via chemical vapor deposition) on one or more other layers of emitter 200.

As shown, dielectric passivation/mirror layer 214 may include one or more dielectric via openings 206 that provide electrical access to P-Ohmic metal layer 204. Optical aperture 208 may include a portion of dielectric passivation/mirror layer 214 over current confinement aperture 210 via which light may be emitted.

P-Ohmic metal layer 204 may include a layer that makes electrical contact via which electrical current may flow. For example, P-Ohmic metal layer 204 may include a TiAu layer, a TiPtAu layer, or the like, via which electrical current may flow (e.g., via a bond pad (not shown) that contacts P-Ohmic metal layer 204 through dielectric via openings 206).

In some implementations, emitter 200 may be manufactured using a series of steps. For example, bottom mirror 224, active region 222, oxidation layer 220, and top mirror 218 may be epitaxially grown on substrate layer 226, after which P-Ohmic metal layer 204 may be deposited on top mirror 218. Next, oxidation trenches 212 may be etched to expose oxidation layer 220 for oxidation. Implant isolation material 216 may be created via ion implantation, after which dielectric passivation/mirror layer 214 may be deposited. Dielectric via openings 206 may be etched in dielectric passivation/mirror layer 214 (e.g., to expose P-Ohmic metal layer for contact). Plating, seeding, and etching may be performed, after which substrate layer 226 may be thinned and/or lapped to a target thickness. Finally, backside cathode layer 228 may be deposited on a bottom side of substrate layer 226.

The number, arrangement, thicknesses, order, symmetry, or the like, of layers shown in FIG. 2B is provided as an example. In practice, emitter 200 may include additional layers, fewer layers, different layers, differently constructed layers, or differently arranged layers than those shown in FIG. 2B. Additionally, or alternatively, a set layers (e.g., one or more layers) of emitter 200 may perform one or more functions described as being performed by another set of layers of emitter 200.

Figure 3:
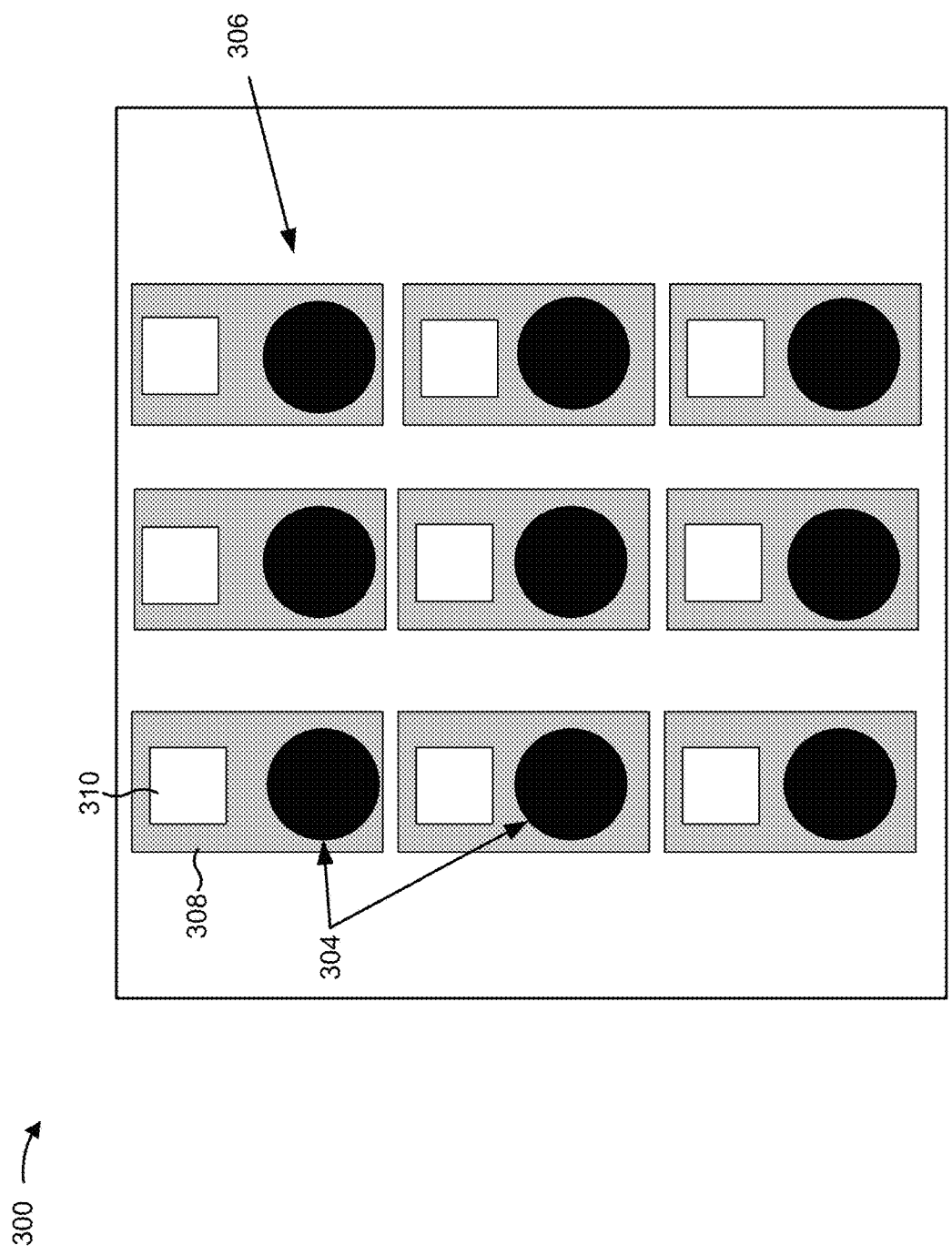
FIG. 3 is a diagram depicting a top-view of an example emitter array that includes a reconfigurable uniform pattern of vertical-emitting devices.

FIG. 3 is a diagram of an example implementation 300 depicting a top-view of an emitter array that includes a reconfigurable uniform pattern of vertical-emitting devices. As shown in FIG. 3, implementation 300 includes emitter array 302.

As shown in FIG. 3, emitter array 302 includes an array of vertical-emitting devices 304. For example, vertical-emitting device 304 may include a VCSEL (e.g., a top-emitting VCSEL or a bottom emitting VCSEL), a light emitting diode (LED), a vertical-emitting laser, and/or the like. As shown by reference number 306, the vertical-emitting devices 304 may be arranged in a particular pattern. For example, and as shown in FIG. 3, vertical-emitting devices 304 of emitter array 302 may be arranged in a uniform pattern of vertical-emitting devices 304 (e.g., a two-dimensional uniform pattern), such as a three-by-three matrix pattern of vertical-emitting devices 304. In some implementations, vertical-emitting devices 304 may be closely spaced for better pattern resolution (e.g., approximately 25 microns apart). Although shown as a matrix pattern, vertical-emitting devices 304 may be arranged in another type of uniform pattern, such as a grid pattern, a lattice pattern, or a honeycomb pattern. Conversely, vertical-emitting devices 304 of emitter array 302 may be arranged in a non-uniform pattern (e.g., a random pattern), in some implementations.

As further shown in FIG. 3, emitter array 302 may include a metal interconnect 308 for each vertical-emitting device 304 of emitter array 302. For example, metal interconnect 308 can be comprised of gold, aluminum, nickel, copper, and/or another material that is electrically conductive. In some implementations, metal interconnect 308 may be transparent to the emission wavelengths or may be opaque with openings for optical emission. As further shown in FIG. 3, emitter array 302 may include an electrical contact 310 for each vertical-emitting device 304 of emitter array 302. Electrical contact 310 can be comprised of gold, aluminum, nickel, copper, and/or another material that is electrically conductive. In some implementations, electrical contact 310 may include metal interconnect 308. In some implementations, electrical contact 310 may be transparent to the emission wavelengths or may be opaque with openings for optical emission. In some implementations, electrical contact 310 may be raised above other elements of emitter array 302, so that electrical contact 310 can be contacted without contacting other elements of emitter array 302, as described elsewhere herein. Additionally, or alternatively, each electrical contact 310 may be approximately the same height from a surface of emitter array 302 (e.g., each electrical contact 310 may have a height of between approximately five microns to approximately 10 microns and electrical contacts 310 of emitter array 302 may have a height that is within approximately two microns of each other). Additionally, or alternatively, each electrical contact 310 may be co-located with and/or electrically connected to a corresponding vertical-emitting device 304 (e.g., may be located proximate to a corresponding vertical-emitting device 304, may be located within a threshold distance of a corresponding vertical-emitting device 304, etc.)

In some implementations, the combination of metal interconnect 308 and electrical contact 310 may facilitate individual powering of a corresponding vertical-emitting device 304 of emitter array 302. For example, electrical current provided to a particular electrical contact 310 may power a corresponding vertical-emitting device 304 via a corresponding metal interconnect 308. In some implementations, each electrical contact 310 may electrically connect (e.g., power) a corresponding vertical-emitting device 304 without powering another vertical-emitting device 304 of emitter array 302. In other words, each vertical-emitting device 304 (and corresponding metal interconnect 308 and electrical contact 310) may be electrically isolated from other vertical-emitting devices 304 of emitter array 302 and may be independently addressable via a corresponding electrical contact 310 and metal interconnect 308.

In this way, different patterns of vertical-emitting devices 304 of emitter array 302 can be powered such that emitter array 302 emits different patterns of light (e.g., by powering different patterns of vertical-emitting devices 304). For example, the different patterns of light emitted from emitter array 302 may be different than the pattern of vertical-emitting devices 304 included in emitter array 302. Continuing with the previous example, although emitter array 302 has a three-by-three pattern of vertical-emitting devices 304, a single vertical-emitting device 304 may be powered, a two-by-two pattern of vertical-emitting devices 304 may be powered, two or more vertical-emitting devices 304 of emitter array 302 may be powered, and/or the like.

In this way, emitter array 302 may be configured in a manner that facilitates reconfiguration of a pattern of vertical-emitting devices 304 of emitter array 302 that are powered. This reduces or eliminates a need for different emitter arrays 302 with different patterns of vertical-emitting devices 304 to be manufactured, thereby reducing a cost and/or complexity of manufacturing emitter arrays 302. In addition, this facilitates use of emitter array 302, with a pattern of vertical-emitting devices 304, in different contexts that are associated with different patterns of vertical-emitting devices 304. Further, this reduces or eliminates a need to swap out emitter array 302 with another emitter array 302 when a different pattern of vertical-emitting devices 304 is needed, thereby conserving time and/or costs associated with swapping out emitter array 302.

As indicated above, FIG. 3 is provided merely as an example. Other examples are possible and may differ from what was described with regard to FIG. 3. In some implementations, one or more electrical contacts 310 may electrically connect to more than one corresponding vertical-emitting device 304. In some implementations, one metal interconnect 308 may electrically connect one or more electrical contacts 310 and more than one vertical-emitting device 304. In this manner, groups of vertical-emitting devices 304 may be controlled collectively with fewer electrical contacts 310 allowing tighter pitch at the cost of individual control of each vertical-emitting device 304.

Figure 4:
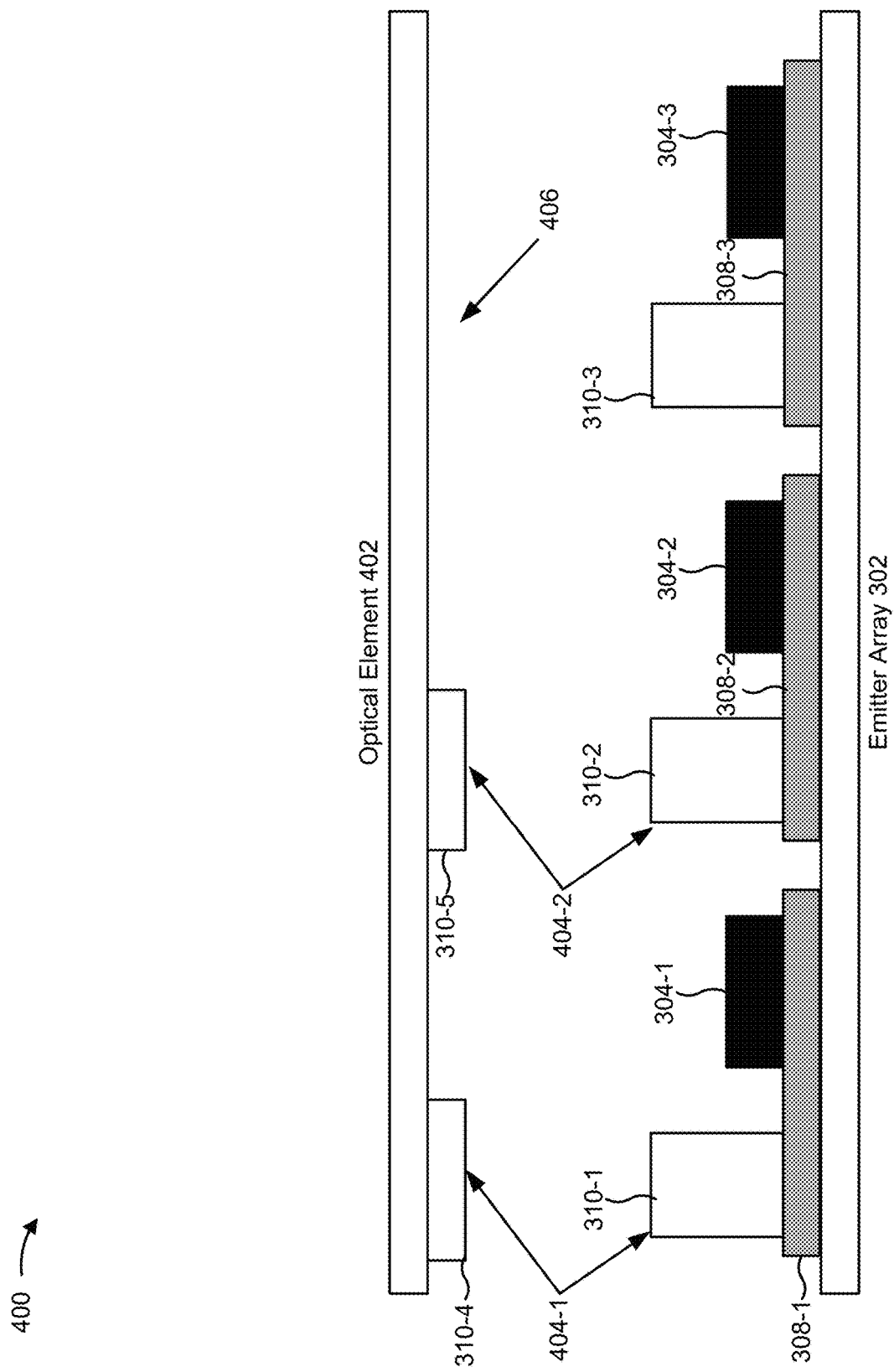
FIG. 4 is a diagram depicting a cross-sectional view of an example emitter array that includes a reconfigurable uniform pattern of vertical-emitting devices and a corresponding optical element to power an emission pattern of the emitter array.

FIG. 4 is a diagram of an example implementation 400 depicting a cross-sectional view of an example emitter array that includes a reconfigurable pattern of vertical-emitting devices and a corresponding optical element to power an emission pattern of vertical-emitting devices of the emitter array. As shown in FIG. 4, implementation 400 includes emitter array 302 and optical element 402 (e.g., a lens, a plate of glass or plastic, a diffractive optical element (DOE), etc. that includes electrically conducting material, such as an electrically conductive layer or pattern of electrically conductive material that can be used to form an electrical connection with emitter array 302). For FIG. 4, assume for example that emitter array 302 includes at least three vertical-emitting devices 304 (shown as vertical-emitting device 304-1 through 304-3).

As further shown in FIG. 4, each of vertical-emitting devices 304-1 through 304-3 may have corresponding electrical contacts 310 (shown as electrical contacts 310-1 through 310-3) and metal interconnects 308 (shown as metal interconnects 308-1 through 308-3). As shown in FIG. 4, electrical contacts 310-1 through 310-3 may extend to approximately the same height. Additionally, or alternatively, electrical contacts 310-1 through 310-3 may extend to a height that is greater than other elements of emitter array 302 (e.g., vertical-emitting devices 304-1 through 304-3, metal interconnects 308-1 through 308-3, etc.).

In some implementations, optical element 402 may include electrical contacts 310 that correspond to vertical-emitting devices 304 of emitter array 302 that are to be powered. For example, electrical contacts 310 included in optical element 402 may be arranged in the same pattern as vertical-emitting devices 304 that are to be powered, in the same pattern as a subset of interconnected electrical contacts 310 of emitter array 302 to be used to power an emission pattern, and/or the like. Additionally, or alternatively, optical element 402 may be configured such that electrical contacts 310 of optical element 402 can contact corresponding electrical contacts 310 of emitter array 302 when optical element 402 is positioned on and/or electrically coupled with emitter array 302. For example, and as shown by reference numbers 404-1 and 404-2, when optical element 402 is positioned on and/or electrically coupled with emitter array 302, electrical contact 310-4 and electrical contact 310-1 may be contacted and electrical contact 310-5 and electrical contact 310-2 may be contacted. In this way, vertical-emitting devices 304-1 and 304-2 may be powered. In addition, in this way, electrical contacts 310 may provide mechanical support for an adjacent element (e.g., optical element 402), such as an adjacent element that is mechanically supported on, and electrically connected to, a subset of a plurality of electrical contacts 310 of emitter array 302. For example, electrical contacts 310 may provide mechanical support to the adjacent element over a plurality of vertical-emitting devices 304 via physical contact of the adjacent element with electrical contacts 310 and may provide an electrical connection between the adjacent element and selected electrical contacts 310. In some implementations, and continuing still with the previous example, the adjacent element may be transmissive to emissions from vertical-emitting devices 304 of emitter array 302.

In addition, and as shown by reference number 406, optical element 402 may not include a particular electrical contact 310 that corresponds to electrical contact 310-3 associated with vertical-emitting device 304-3. As such, when optical element 402 is positioned on and/or electrically coupled with emitter array 302, vertical-emitting device 304-3 may not be powered. Other optical elements 402 may include different configurations of electrical contacts 310 so that different patterns of vertical-emitting devices 304 can be powered.

In some implementations, optical element 402 may include other elements than those shown in FIG. 4. For example, optical element 402 may include electrical bonding to electrically couple optical element 402 to a power source (e.g., a laser driver). Additionally, or alternatively, and as another example, optical element 402 may include one or more metal interconnects to connect electrical contacts 310 of optical element 402 to a power source. For example, a pattern of electrically conductive material included in optical element 402 may electrically contact particular electrical contacts 310 of emitter array 302 (without electrically contacting other electrical contacts 310 of emitter array 302) to power vertical-emitting devices 304 of emitter array 302 associated with the particular electrical contacts 310. In some implementations, the pattern of electrically conductive material included in optical element 402 may extend toward an edge of optical element 402 where the electrically conductive material can electrically connect to a power supply (e.g., traces of electrically conductive material for the particular electrical contacts 310 may extend toward the edge of optical element 402 where the traces can electrically connect to a power supply).

In this way, an emission pattern of vertical-emitting devices 304 of emitter array 302 may be powered via electrical contact between a pattern of electrical contacts 310 and a pattern of electrically conductive material included optical element 402 (e.g., where the electrically conductive material is electrically connected to a power supply. For example, the emission pattern of vertical-emitting devices 304 that is powered may be different than the pattern of vertical-emitting devices 304 included in emitter array 302 (e.g., may be a different uniform pattern, may be a non-uniform pattern, may be a random pattern, etc.). This facilitates reconfiguration of vertical-emitting devices 304 of emitter array 302 that are powered. In addition, this reduces or eliminates a need for emitter array 302 to be replaced when a different pattern of vertical-emitting devices 304 is needed. For example, to configure a different pattern, a different optical element 402 may be provided with a different configuration of contacted electrical contacts 310, or different electrical contacts on the optical element 402 may be powered.

As indicated above, FIG. 4 is provided merely as an example. Other examples are possible and may differ from what was described with regard to FIG. 4. For example, optical element 402 may include a different configuration of electrical contacts 310 to power a different pattern of vertical-emitting devices 304 (e.g., to power a different emission pattern).

Figure 5:
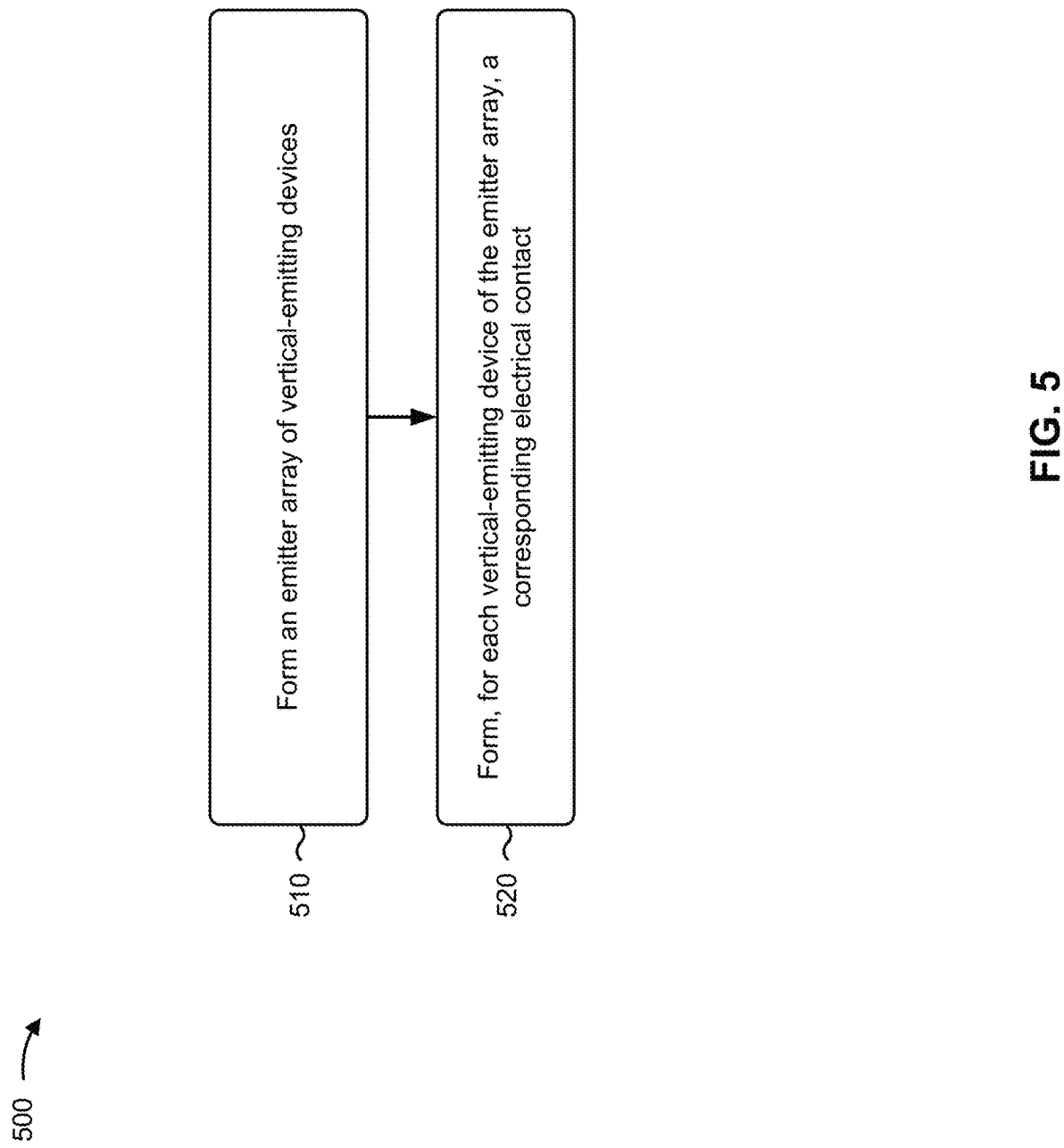
FIG. 5 is a flow chart of an example process for manufacturing a reconfigurable emitter array that includes a reconfigurable uniform pattern of vertical-emitting devices.

FIG. 5 is a flow chart of an example process 500 for manufacturing a reconfigurable emitter array. For example, FIG. 5 shows an example process for manufacturing emitter array 302 that includes electrical contacts 310 for powering different patterns of vertical-emitting devices 304 of emitter array 302.

As shown in FIG. 5, process 500 may include forming an emitter array of vertical-emitting devices (block 510). For example, process 500 may include forming emitter array 302 of vertical-emitting devices 304.

In some implementations, to form emitter array 302, various epitaxial layers may be formed on a substrate layer. For example, the substrate layer may include a gallium arsenide (GaAs) substrate. In some implementations, trenches may be etched into layers of emitter array 302 (e.g., using a wet etching technique or a dry etching technique). For example, the trenches may electrically isolate sets of vertical-emitting devices 304 of emitter array 302 from each other (e.g., the trenches may be etched into a substrate layer of emitter array 302).

In some implementations, vertical-emitting devices 304 may be formed in a pattern. For example, vertical-emitting devices 304 may be formed in a uniform pattern, such as a matrix pattern, a lattice pattern, and/or the like. In some implementations, and as another example, vertical-emitting devices 304 may be formed in a non-uniform pattern, such as a random pattern, a non-repeating pattern, and/or the like. In some implementations, and as yet another example, some vertical-emitting devices 304 may be formed in a uniform pattern and some vertical-emitting devices 304 may be formed in a non-uniform pattern.

In some implementations, one or more additional layers may be formed on emitter array 302 (e.g., after vertical-emitting devices 304 have been formed, after trenches have been etched on emitter array 302, etc.). For example, a passivation layer may be formed on emitter array 302. Additionally, or alternatively, metal interconnects 308 may be formed on emitter array 302 (e.g., after vertical-emitting devices 304 have been formed). For example, metal interconnects 308 may be formed such that each vertical-emitting device 304 of emitter array 302 has a corresponding metal interconnect 308. Continuing with the previous example, a first vertical-emitting device 304 may have a corresponding first metal interconnect 308 and a second vertical-emitting device 304 of emitter array 302 may have a corresponding second metal interconnect 308. In some implementations, forming a metal interconnect 308 may electrically connect the metal interconnect 308 to a corresponding vertical-emitting device 304.

In this way, process 500 may include forming emitter array 302 of vertical-emitting devices 304.

As further shown in FIG. 5, process 500 may include forming, for each vertical-emitting device of the emitter array, a corresponding electrical contact (block 520). For example, process 500 may include forming, for each vertical-emitting device 304 of emitter array 302, a corresponding electrical contact 310.

In some implementations, electrical contact 310 may be formed on metal interconnect 308. In this way, electrical contact 310 and vertical-emitting device 304 may be electrically connected. In some implementations, electrical contact 310 may be formed such that each vertical-emitting device 304 of emitter array 302 has at least one corresponding electrical contact 310. For example, a first vertical-emitting device 304 may have a corresponding first electrical contact 310 and a second vertical-emitting device 304 may have a corresponding second electrical contact 310. Additionally, or alternatively, electrical contacts 310 may be formed such that electrical contacts 310 for different vertical-emitting devices 304 of the same emitter array 302 extend to approximately the same height. For example, electrical contacts 310 may be formed such that the heights of electrical contacts 310 of emitter array 302 have a height within each other that facilitates bonding to a set of bond pads or electrically conductive material included in optical element 402 (e.g., electrically conductive material that can be electrically connected to a power supply to power vertical-emitting devices 304 of emitter array 302).

Additionally, or alternatively, electrical contacts 310 may be formed such that electrical contacts 310 extend to a height that is higher than other elements of emitter array 302 on a same surface as electrical contacts 310. For example, electrical contacts 310 may extend to a height that is higher than metal interconnects 308 of emitter array 302 and/or that is higher than vertical-emitting devices 304 of emitter array 302. In this way, each electrical contact 310 provides a surface that can be contacted by a component of another device, such as optical element 402, without contacting other elements of emitter array 302.

In this way, process 500 may include forming, for each vertical-emitting device 304 of emitter array 302, a corresponding electrical contact 310.

Although FIG. 5 shows example blocks of process 500, in some implementations, process 500 may include additional blocks, fewer blocks, different blocks, or differently arranged blocks than those depicted in FIG. 5. Additionally, or alternatively, two or more of the blocks of process 500 may be performed in parallel.

In this way, emitter array 302 may be configured such that different emission patterns of vertical-emitting devices 304 can be powered (e.g., such that different subsets of vertical-emitting devices 304 can be powered via corresponding subsets of metal interconnects 308 and electrical contacts 310). For example, an emission pattern may correspond to a pattern of a subset of a plurality of VCSELs that is powered. This improves an efficiency of reconfiguring a device that uses emitter array 302 by reducing or eliminating a need to replace a first emitter array 302 that has a first emission pattern of vertical-emitting devices 304 with a second emitter array 302 that has a second emission pattern of vertical-emitting devices 304. In addition, this improves use of emitter array 302 by facilitating more cost-effective manufacturing of a single configuration of emitter array 302 that can be coupled with an adjacent element (e.g., optical element 402) to selectively power vertical-emitting devices 304 causing emitter array 302 to emit different patterns of light. This reduces or eliminates a need for many different emitter arrays 302 to be manufactured, each with different, specific emission patterns of vertical-emitting devices 304.

The foregoing disclosure provides illustration and description, but is not intended to be exhaustive or to limit the implementations to the precise form disclosed. Modifications and variations are possible in light of the above disclosure or may be acquired from practice of the implementations.

Some implementations are described herein in connection with thresholds. As used herein, satisfying a threshold may refer to a value being greater than the threshold, more than the threshold, higher than the threshold, greater than or equal to the threshold, less than the threshold, fewer than the threshold, lower than the threshold, less than or equal to the threshold, equal to the threshold, or the like.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Furthermore, as used herein, the term "set" is intended to include one or more items (e.g., related items, unrelated items, a combination of related and unrelated items, etc.), and may be used interchangeably with "one or more." Where only one item is intended, the term "one" or similar language is used. Also, as used herein, the terms "has," "have," "having," or the like are intended to be open-ended terms. Further, the phrase "based on" is intended to mean "based, at least in part, on" unless explicitly stated otherwise.

What is claimed is:

1. A vertical cavity surface emitting laser (VCSEL) array, comprising:
    a plurality of VCSELs,
        wherein the plurality of VCSELs are in a two-dimensional pattern of VCSELs;
    a plurality of electrical contacts on a surface of the VCSEL array,
        wherein an electrical contact, of the plurality of electrical contacts, is co-located with a corresponding VCSEL of the plurality of VCSELs,
        wherein the plurality of electrical contacts provides mechanical support to an adjacent element over the plurality of VCSELs,
    wherein the adjacent element includes an optical element that provides a lensing effect and another plurality of electrical contacts,
        wherein the other plurality of electrical contacts is arranged in a pattern corresponding to a subset of the plurality of electrical contacts,
        wherein the plurality of electrical contacts include at least one electrical contact that does not correspond to any electrical contact of the adjacent element,
        wherein the plurality of electrical contacts extends to approximately a same height, and
        wherein the plurality of electrical contacts has a height that is greater than other elements of the VCSEL array on a same surface as the plurality of electrical contacts; and
    a plurality of metal interconnects on the surface of the VCSEL array,
        wherein one of the plurality of metal interconnects electrically connects one of the plurality of electrical contacts and one of the plurality of VCSELs that corresponds to the one of the plurality of electrical contacts, and
        wherein a subset of the plurality of VCSELs can be powered via a corresponding subset of the plurality of electrical contacts and a corresponding subset of the plurality of metal interconnects to power an emission pattern that is different than the two-dimensional pattern of VCSELs.

2. The VCSEL array of claim 1, wherein each of the plurality of VCSELs is independently addressable via a corresponding electrical contact and a corresponding metal interconnect.

3. The VCSEL array of claim 1, wherein the adjacent element is mechanically supported over the plurality of VCSELs.

4. The VCSEL array of claim 1, wherein the two-dimensional pattern of VCSELs is uniform.

5. The VCSEL array of claim 1, wherein the emission pattern corresponds to a pattern of the subset of the plurality of VCSELs.

6. The VCSEL array of claim 1, wherein the one of the plurality of VCSELs, the one of the plurality of electrical contacts, and the one of the plurality of metal interconnects are electrically isolated from other VCSELs of the plurality of VCSELs, other electrical contacts of the plurality of electrical contacts, and other metal interconnects of the plurality of metal interconnects.

7. The VCSEL array of claim 1, wherein the VCSEL array is a top-emitting VCSEL array or a bottom-emitting VCSEL array.

8. The VCSEL array of claim 1, wherein a VCSEL, of the plurality of VCSELs and co-located with the at least one electrical contact that does not correspond to any electrical contact of the adjacent element, is not powered.

9. A method, comprising:
forming an emitter array,
wherein forming the emitter array comprises forming a plurality of vertical-emitting devices arranged in a two-dimensional pattern;
forming a plurality of metal interconnects on the emitter array,
wherein forming the plurality of metal interconnects electrically connects each metal interconnect to a corresponding vertical-emitting device of the plurality of vertical-emitting devices;
forming a plurality of electrical contacts on the plurality of metal interconnects,
wherein forming the plurality of electrical contacts electrically connects each of the plurality of electrical contacts to a corresponding metal interconnect of the plurality of metal interconnects,
wherein forming the plurality of electrical contacts comprises forming each of the plurality of electrical contacts to be co-located with the corresponding vertical-emitting device of the plurality of vertical-emitting devices, and
wherein forming the plurality of electrical contacts comprises forming the plurality of electrical contacts to extend to a height that is greater than other elements of the emitter array; and
bonding an adjacent element to a least a subset of the plurality of electrical contacts,
wherein the adjacent element includes an optical element that provides a lensing effect and another plurality of electrical contacts,
wherein the other plurality of electrical contacts is arranged in a pattern corresponding to the subset of the plurality of electrical contacts, and
wherein the plurality of electrical contacts include at least one electrical contact that does not correspond to any electrical contact of the adjacent element.

10. The method of claim 9, wherein forming the emitter array comprises:
forming the emitter array such that the plurality of vertical-emitting devices are electrically isolated from each other and such that the plurality of metal interconnects are electrically isolated from each other.

11. The method of claim 9, wherein forming the plurality of vertical-emitting devices, forming the plurality of metal interconnects, and forming the plurality of electrical contacts comprise:
forming the plurality of vertical-emitting devices, forming the plurality of metal interconnects, and forming the plurality of electrical contacts in a manner that facilitates powering of an emission pattern that is different than the two-dimensional pattern of the emitter array.

12. The method of claim 9, wherein forming the emitter array comprises:
forming the plurality of vertical-emitting devices on a substrate layer prior to forming the plurality of electrical contacts.

13. The method of claim 12, wherein forming the emitter array comprises:
forming the plurality of metal interconnects after forming the plurality of vertical-emitting devices and prior to forming the plurality of electrical contacts.

14. An emitter array, comprising:
a plurality of vertical-emitting devices,
wherein the plurality of vertical-emitting devices are in a two-dimensional pattern of vertical-emitting devices;
a plurality of electrical contacts on a surface of the emitter array,
wherein each of the plurality of electrical contacts is co-located with and electrically connected to a corresponding vertical-emitting device of the plurality of vertical-emitting devices,
wherein the plurality of electrical contacts provide mechanical support over the plurality of vertical-emitting devices,
wherein the plurality of electrical contacts extend to approximately a same height; and
wherein a subset of the plurality of vertical-emitting devices can be powered via a corresponding subset of the plurality of electrical contacts; and
an adjacent element mechanically supported on, and electrically connected to, the subset of the plurality of electrical contacts,
wherein the adjacent element includes an optical element that provides a lensing effect and another plurality of electrical contacts,
wherein the other plurality of electrical contacts is arranged in a pattern corresponding to the subset of the plurality of electrical contacts, and
wherein the plurality of electrical contacts include at least one electrical contact that does not correspond to any electrical contact of the adjacent element.

15. The emitter array of claim 14, wherein each of the plurality of electrical contacts has a height that is greater than other features of the emitter array.

16. The emitter array of claim 14, wherein the subset of the plurality of vertical-emitting devices is to emit light in a pattern that is different than the two-dimensional pattern of vertical-emitting devices.

17. The emitter array of claim 14,
wherein the other plurality of electrical contacts are electrically interconnected.

18. The emitter array of claim 14, wherein the two-dimensional pattern is at least one of:
a matrix pattern,
a grid pattern,
a lattice pattern, or
a honeycomb pattern.

19. The emitter array of claim 14, wherein each of the plurality of vertical-emitting devices is electrically isolated from other vertical-emitting devices of the plurality of vertical-emitting devices.

20. The emitter array of claim 14, wherein each of the vertical-emitting devices is independently addressable via a corresponding electrical contact; and
each electrical contact comprises a corresponding metal interconnect.

* * * * *